United States Patent
Sakai et al.

[19]
[11] Patent Number: 5,940,303
[45] Date of Patent: Aug. 17, 1999

[54] SEMICONDUCTOR DEVICE TEST SYSTEM

[75] Inventors: Iwao Sakai; Naoyuki Sinonaga; Sinji Senba; Mamoru Miyamoto, all of Tokyo, Japan

[73] Assignee: Mitsubishi Denki Kabushiki Kaisha, Tokyo, Japan

[21] Appl. No.: 08/901,783

[22] Filed: Jul. 28, 1997

[30] Foreign Application Priority Data

Feb. 13, 1997 [JP] Japan ................................. 9-029053

[51] Int. Cl.$^6$ .......................... G06F 17/00; G01R 31/26
[52] U.S. Cl. ................. 364/478.02; 364/478.08; 364/478.16; 364/468.28; 324/765
[58] Field of Search ................ 364/478.01, 478.02, 364/478.08, 478.1, 478.16, 490, 468.03, 468.28; 29/740, 741; 324/754, 755, 537, 765

[56] References Cited

U.S. PATENT DOCUMENTS

| | | | |
|---|---|---|---|
| 4,817,273 | 4/1989 | Lape et al. | 29/741 |
| 5,093,984 | 3/1992 | Lape | 29/741 |
| 5,148,100 | 9/1992 | Sekiba | 324/158 F |
| 5,509,193 | 4/1996 | Nuxoll | 29/741 |
| 5,650,732 | 7/1997 | Sakai | 324/755 |

FOREIGN PATENT DOCUMENTS

| | | |
|---|---|---|
| 62-028678 | 2/1987 | Japan . |
| 5160218 | 6/1993 | Japan . |
| 7167911 | 7/1995 | Japan . |
| 8139144 | 5/1996 | Japan . |

OTHER PUBLICATIONS

"Hardware Specifications for AF–8630 Test Burn–in Test System" 7th ed., Ando Electric Co., Ltd. (Dec. 20, 1991).

*Primary Examiner*—Paul P. Gordon
*Attorney, Agent, or Firm*—Leydig, Voit & Mayer

[57] ABSTRACT

A semiconductor device test system includes a first warehouse, an insertion and extraction unit, a second warehouse, a test burn-in unit, and a scheduler. The scheduler sets a test schedule so that the test burn-in unit tests the semiconductor devices according to the type of semiconductor devices, based on product data transmitted from the first and second warehouses. The scheduler issues an instruction to transfer a desired burn-in board from the second warehouse to the insertion and extraction unit based on the insertion and extraction schedule. The scheduler issues an instruction to transfer the desired burn-in board from the insertion and extraction unit to the second warehouse based on the insertion and extraction schedule. A high throughput test system is thus provided that concurrently carries out the insertion and extraction of semiconductor devices with respect to burn-in boards.

8 Claims, 3 Drawing Sheets

SEMICONDUCTOR DEVICE TEST SYSTEM

BACKGROUND OF THE INVENTION

1. Field of the Invention

The present invention relates to a semiconductor device test system for testing semiconductor devices at a low cost and high efficiency.

2. Description of the Related Art

FIG. 3 shows the prior art semiconductor test system disclosed in the Dec. 20, 1991 issue of "Hardware Specifications for AF-8630 Test Burn-in Test System" in its seventh edition published by ANDO ELECTRIC CO., LTD. Shown in FIG. 3 are pallets 1, each of which is loaded with a plurality types of semiconductor devices 2 according to the type of semiconductor device, magazines 3, each for accommodating a plurality of pallets, a first shelf 4 for storing the magazines 3 and a plurality of burn-in carriers 11 loaded with no semiconductor devices 2, a first operator 5 who transports a magazine 3 on a platform truck 6 or a burn-in carrier 11 on a platform truck 13, between the first shelf 4 and an insertion unit to be described later, and burn-in boards 7 which receive semiconductor devices 2 at its test sockets 8 according to the type of semiconductor devices. The pallets 1 and the magazines 3 are intentionally depicted as a round structure in shape to discriminate them from the burn-in boards 7 and the burn-in carriers 11 in FIG. 3, and are not limited to these shapes.

Also shown are the insertion unit 9 for picking up a semiconductor device 2 from a pallet 1 loaded with semiconductor devices and placing it to a burn-in board 7 loaded with no semiconductor devices 2, an extractor unit 10 for extracting a semiconductor device 2 from a burn-in board 7 loaded with semiconductor devices 2 and placing it on a pallet 1 to be loaded with semiconductor devices 2, burn-in carriers 11 for accommodating a plurality of burn-in boards 7, and an operator 12 who transports a burn-in carrier 11 on a platform truck 13 between the insertion unit 9 or the extractor unit 10 and a TBI unit to be described later.

Further shown in FIG. 3 are a TBI (test burn-in) unit 14 for carrying out burn-in tests to the semiconductor devices 2 on a burn-in board 7 according to the type of the semiconductor devices, and a TBI host 15 connected to the insertion unit 9, extractor unit 10, and TBI unit 14, for collecting product data about the semiconductor devices 2 placed by the insertion unit 9, transmitting a test program to the TBI unit 14 based on the product data, and instructing the extractor unit 10 to extract and reject any semiconductor devices 2 identified as faulty by the test result.

The operation of the semiconductor device test system thus constructed is now discussed. Stored on the first shelf 4 is the magazine 3 in which a plurality of pallets 1 are held. Each of the pallets 1 holds a plurality of types of semiconductor devices according to the type of semiconductor devices. Also stored on the first shelf 4 is the burn-in carrier 11 that holds a plurality of burn-in boards 7, each of which is empty and prepared to be loaded with a plurality of types of semiconductor devices according the type of semiconductor device. The first operator 5 picks up from the first shelf 4 the magazine 3 holding semiconductor devices 2 of the same type, and mounts it on the platform truck 6 for transportation to the insertion unit 9. Further, the first operator 5 picks up from the first shelf 4 the burn-in carrier 11 which has no semiconductors thereon and is ready to receive the semiconductor devices of the same type, and mounts in on the platform truck 13 for transportation to the insertion unit 9. The insertion unit 9 picks up the semiconductor devices 2 from the pallet 1 and places them into the sockets 8 on the burn-in board 7.

Meanwhile, the product data about the semiconductor devices 2 on the burn-in board 7 is transmitted to the TBI host 15. The plurality of such burn-in boards 7 are held in the burn-in carrier 11. The second operator 12 picks up the burn-in carrier 11 having the semiconductor devices of the same type from the insertion unit 9, and mounts it on the platform truck 13 for transportation to the TBI unit 14.

The TBI unit 14 tests the semiconductor devices 2. The tests performed include a burn-in test, and read and write tests, for example. The TBI host 15 transmits to the TBI unit 14 a test program in accordance with the product data of the semiconductor devices 2. After the burn-in carrier 11 has undergone the tests, the second operator 12 picks them up from the TBI unit 14 and transports them on the platform truck 13 to the extractor unit 10.

The extractor unit 10 extracts the semiconductor devices 2 from the burn-in board 7 and places them on the pallet 1. Meanwhile, the TBI host 15 transmits a test result to the extractor unit 10 and any semiconductor devices 2 that are determined to be faulty are picked up and placed on a pallet 1 different from the pallet 1 on which the passed semiconductor devices 2 are placed. A plurality of such pallets 1 are accommodated in the magazine 3. The first operator 5 picks up, from the extractor unit 10, the magazine 3 having the semiconductor devices 2 that have undergone the tests, and transports it on the platform truck 6 to the first shelf 4. In the discussion above, the insertion unit 9 and the extractor unit. 10 are different units for convenience of explanation. In practice, however, an insertion/extractor unit for inserting and extracting the semiconductor devices 2 may be used. By the use of a switch, it may function as the insertion unit 9 and the extractor unit 10.

Since the semiconductor device test system is thus constructed, the semiconductor devices 2 stored on the first shelf 4 have to be tested on the TBI unit 14 on a per semiconductor device type basis. If the TBI unit 14 has the capability to test four burn-in carriers 11 at a time with its test area divided into four partitions, it will be able to concurrently handle four incoming burn-in carriers 11 having four respective different semiconductor device types 2. Thus, the ability of the TBI unit 14 is fully used. This arrangement however needs a costly TBI unit 14 having a multiple test area partitioning capability.

In its low-cost version, the TBI unit 14 may have the capability to test four burn-in carriers at a time with its test area divided into a smaller number of partitions, for example, two partitions. With this arrangement, the TBI unit 14 may make the most efficient use of its ability if two burn-in carriers 11 loaded with two respectively different semiconductor types come in at a time. The actual operation does not necessarily meet such a condition, and if three or more types of semiconductor devices are input, concurrent testing will become impossible, and the TBI unit 14 may be forced at a process yield level lower than the maximum available yield. Thus, the process efficiency of the TBI unit 14 is degraded.

Since the semiconductor devices 2 stored on the first shelf 4 and the semiconductor devices 2 that have undergone the tests have to be subjected to the insertion and extraction operations, the testing operation lacks smoothness, increasing the cost of semiconductor device testing and degrading the efficiency of semiconductor device testing.

SUMMARY OF THE INVENTION

Accordingly, it is an object of the present invention to provide a semiconductor device test system that tests semiconductor devices at a low cost and a high efficiency.

The semiconductor device test system of the present invention comprises a first warehouse for storing pallets on which semiconductor devices are placed, insertion and extraction means for extracting a semiconductor device from a burn-in board and placing the semiconductor device on a pallet, and for picking up a semiconductor device from another pallet and inserting the semiconductor device on the burn-in board, a second warehouse for storing one of a burn-in board which is loaded with a semiconductor device to be tested, a burn-in board which is loaded with a semiconductor device that has undergone a test, and a burn-in board which is loaded with no semiconductors, test means for performing the test to the semiconductor device on the burn-in board, and management means for setting an insertion and extraction schedule so that the insertion and extraction means performs insertion and extraction operations according to the type of semiconductor devices, based on product data, transmitted from the first and second warehouses, about the semiconductor devices stored in the first and second warehouses, for issuing an instruction to transport a desired burn-in board from the second warehouse to the insertion and extraction means based on the insertion and extraction schedule, and for issuing an instruction to transport a desired burn-in board from the insertion and extraction means to the second warehouse based on the insertion and extraction schedule. With this arrangement, the insertion and extraction operations of the semiconductor devices to and from the burn-in boards are concurrently performed, and a highly efficient semiconductor device test system is thus provided.

The semiconductor device test system of the present invention further comprises transport means for transporting the burn-in board that has undergone the insertion and extraction operations, from the insertion and extraction means to the second warehouse, and for transporting the burn-in board, from the second warehouse to the insertion and extraction means for the insertion and extraction operations, and control means for informing the transport means of which burn-in board to transport, based on the insertion and extraction schedule. The insertion and extraction operations of the semiconductor devices are reliably and concurrently performed to the burn-in boards, and a highly efficient semiconductor device test system is thus provided.

In the semiconductor device test system of the present invention, the management means sets the insertion and extraction schedule so that the insertion and extraction operations are forced when the burn-in board loaded with the semiconductor device dwells in the second warehouse for a duration equal to or longer than a predetermined period of time. Thus, semiconductor devices to be inserted or extracted or semiconductor devices that have undergone the insertion and extraction operations are prevented from staying continuously stored and unprocessed.

The semiconductor device test system of the present invention comprises a first warehouse for storing pallets on which semiconductor devices are placed, insertion and extraction means for extracting a semiconductor device from a burn-in board and placing the semiconductor device on a pallet, and for picking up a semiconductor device from another pallet and inserting the semiconductor device on the burn-in board, a second warehouse for storing one of a burn-in board which is loaded with a semiconductor device to be tested, a burn-in board which is loaded with a semiconductor device that has undergone a test, and a burn-in board which is loaded with no semiconductors, test means for performing the test to the semiconductor device on the burn-in board, and management means for setting a test schedule so that the test means tests the semiconductor devices according to the type of semiconductor devices, based on product data, transmitted from the second warehouse, of the semiconductor devices stored in the second warehouse, for issuing an instruction to transmit to the test means a test program that complies with the test schedule, for issuing an instruction to transport a desired burn-in board from the second warehouse to the test means based on the test schedule, and for issuing an instruction to transport a desired burn-in board from the test means to the second warehouse based on the test schedule. The testing of the semiconductor devices is thus performed making efficient use of the process capability of the test means.

The semiconductor device test system of the present invention further comprises transport means for transporting the burn-in board that has undergone the test, from the test means to the second warehouse, and for transporting the burn-in board to be tested, from the second warehouse to the test means, and control means for informing the transport means of which burn-in board to transport, based on the test schedule. The insertion and extraction operations of the semiconductor devices to and from the burn-in board are reliably and concurrently performed to the burn-in boards, and a highly efficient semiconductor device test system is thus provided.

In the semiconductor device test system of the present invention, the management means sets the test schedule so that the test is forced when the burn-in board loaded with the semiconductor device dwells in the second warehouse for a duration equal to or longer than a predetermined period of time. Thus, semiconductor devices to be tested or semiconductor devices that have undergone the test are prevented from staying continuously stored and unprocessed.

When it is determined that a semiconductor device needs retesting in the test means in the semiconductor device test system of the present invention, the management means instructs the control means to cause only the burn-in board having the semiconductor device in need of retesting to remain in the second warehouse. In this way, the management of the semiconductor devices is performed based on a simple test schedule.

When it is determined that a semiconductor device needs retesting in the test means in the semiconductor device test system of the present invention, the management means instructs the control means to cause only the burn-in board having the semiconductor device in need of retesting to remain in the test means. In this way, the management of the semiconductor devices is performed based on a simple test schedule.

DESCRIPTION OF THE PREFERRED EMBODIMENTS

Figure 1:
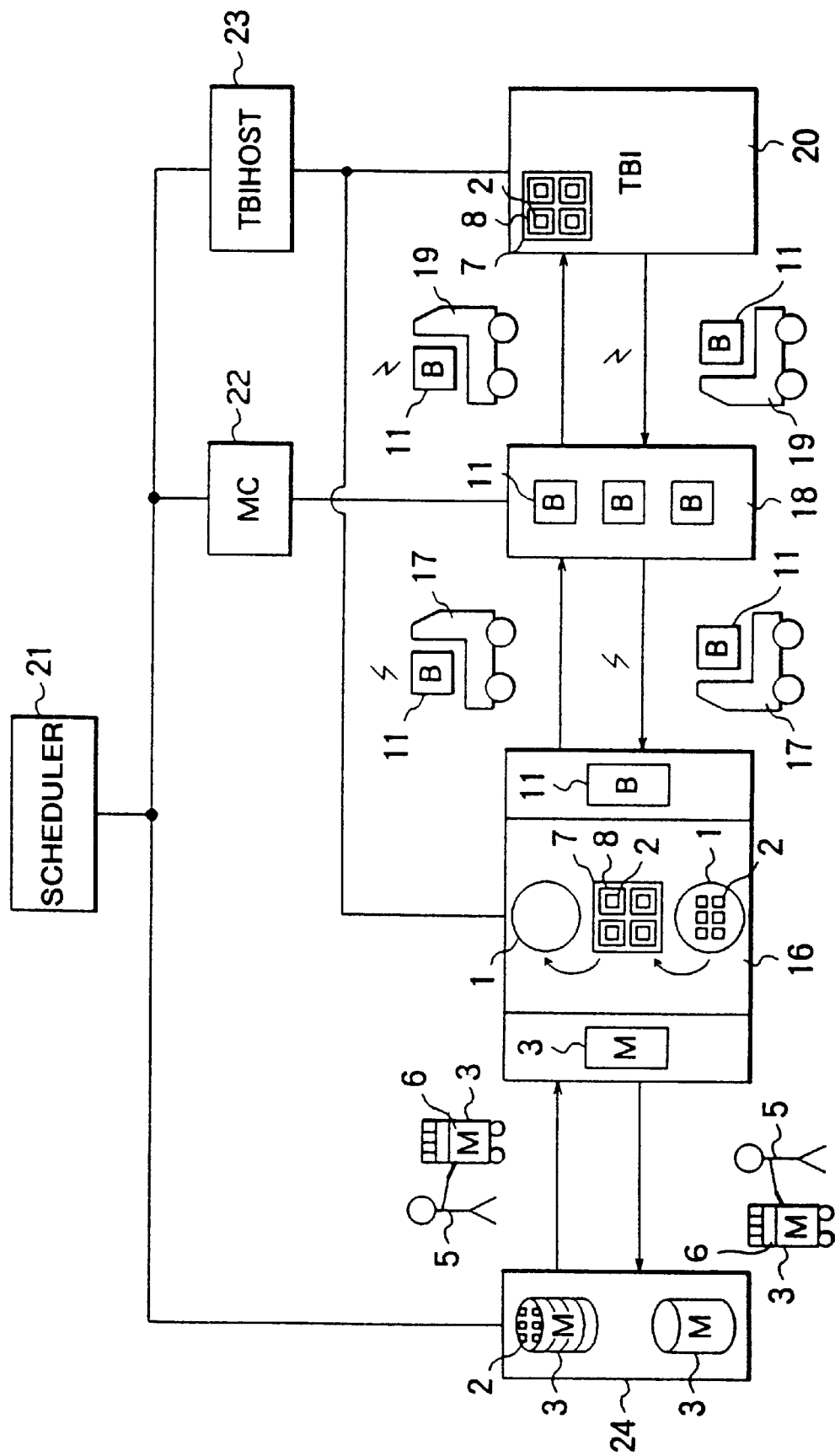
FIG. 1 is a block diagram showing a semiconductor device test system of one embodiment of the present invention.
Figure 2:
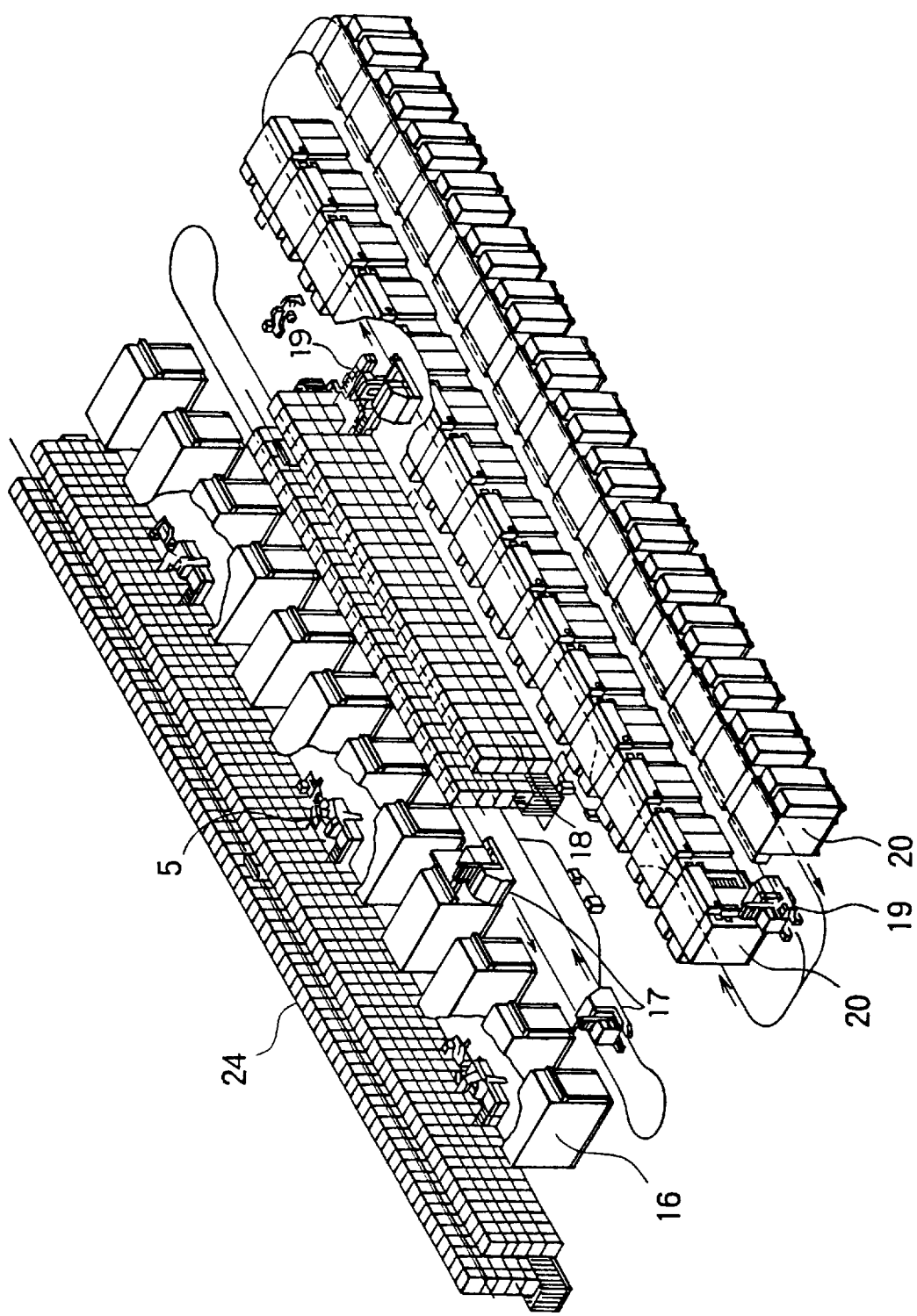
FIG. 2 is a perspective view showing the semiconductor device test system of the embodiment of the present invention in operation.
Figure 3:
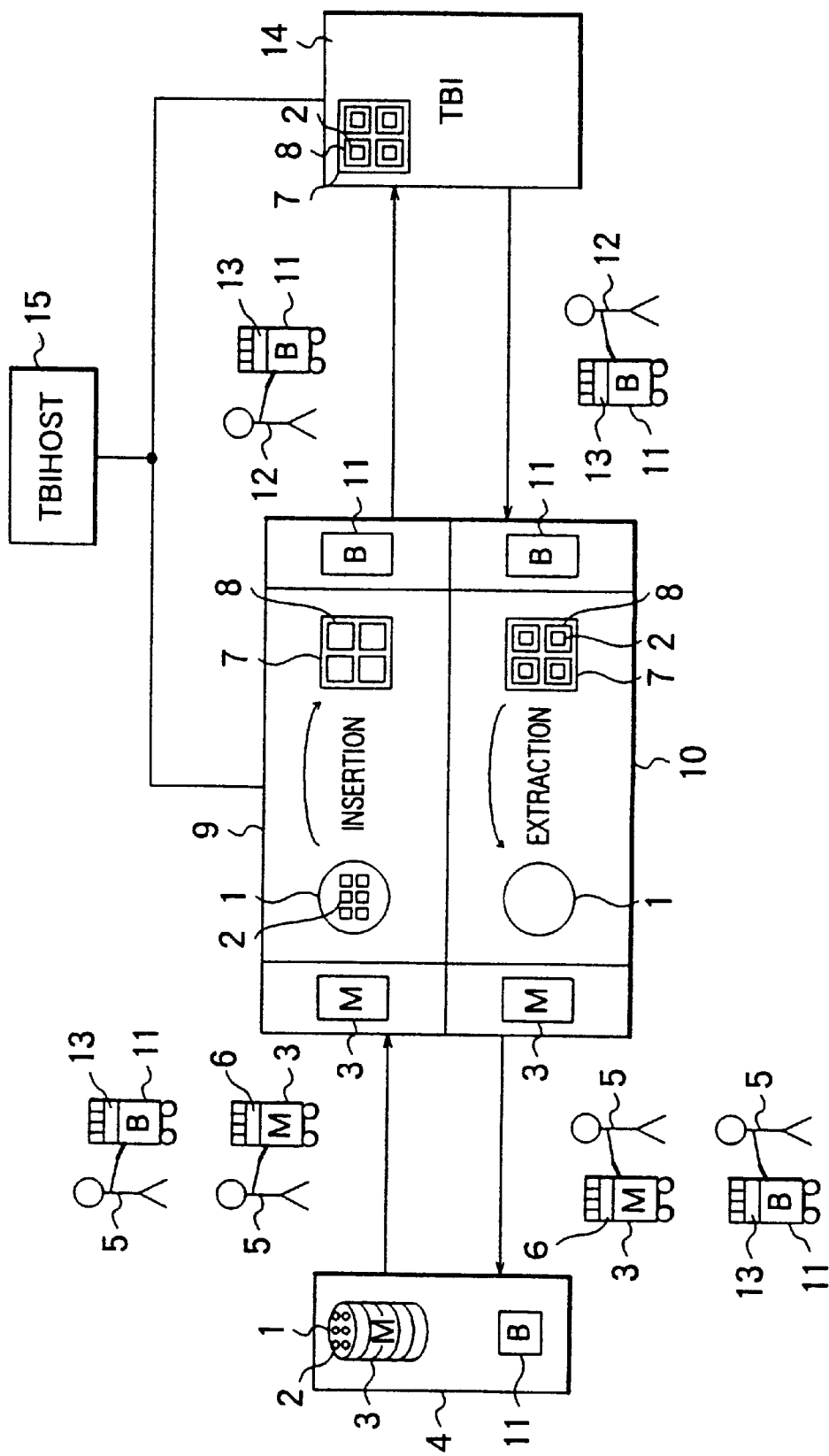
FIG. 3 is a block diagram showing a prior art semiconductor device test system.

Referring to FIGS. 1 and 2, the embodiments of the present invention are now discussed. FIG. 1 is a block diagram showing a semiconductor device test system of one embodiment of the present invention. FIG. 2 is a perspective view showing the semiconductor device test system of the embodiment of the present invention in operation. In the figures, components identical to those described with reference to the prior art shown in FIG. 3 are designated with the same reference numerals.

Shown in FIGS. 1 and 2 are a first automated warehouse (a first warehouse) 24 for storing a plurality of magazines 3 on which semiconductor devices 2 are placed, and an insertion and extraction unit (insertion and extraction means) 16 which extracts semiconductor devices 2 from a burn-in board 7 loaded with the semiconductor devices 2 and places them on a pallet 1 loaded with no semiconductor devices, while picking up semiconductor devices 2 from a pallet 1 loaded with semiconductor devices 2 and then placing them on the burn-in board 7, according to the types of the semiconductor devices.

Also shown are first AGVs (auto guided vehicles) 17 (first transport means) for transporting burn-in carriers 11 on them between the insertion and extraction unit 16 and a second automated warehouse 18, the second automated warehouse 18 (a second warehouse) which stores a plurality of burn-in carriers 11, each burn-in carrier 11 containing a plurality of burn-in boards 7, each being the one loaded with semiconductor devices 2 to be tested, loaded with semiconductor devices 2 that have undergone a test, or loaded with no semiconductor devices, and second AGVs (second transport means) 19 for transporting burn-in carriers 11 on them between the second automated warehouse 18 and a TBI unit 20 to be described later.

Shown further are the TBI unit (test means) 20 for testing and burning in the semiconductor devices 2 up to two types of semiconductor device at a time for example, and a scheduler 21 (management means) connected to the first automated warehouse 24, insertion and extraction unit 16, second automated warehouse 18, and TBI unit 20, for receiving such product data of the semiconductor devices 2 as the types, quantities of semiconductor device and the name of test programs and for setting an insertion and extraction schedule and test schedule.

Shown further are a material handling computer (hereinafter referred to as MC) 22 (first control means) for controlling the first AGVs 17, second automated warehouse 18 and second AGVs 19 based on the insertion and extraction schedule and the test schedule from the scheduler 21, and a TBI host 23 (second control means) connected to the insertion and extraction unit 16 and TBI unit 20, for transmitting the test program to the TBI 20 based on the test schedule, and instructing the insertion and extraction unit 16 to extract and reject any semiconductor devices 2 the test result determines as faulty ones.

The first and second AGVs 17, 19 are battery-operated electric cars which move along a black tape (a black rubber line) stuck on the floor with the aid of an optical sensor. The AGVs 17, 19 communicates in a wireless fashion with MC 22 under control, while optically communicating with the insertion and extraction unit 16, second automated warehouse 18, and TBI unit 20, and fix their own positions using marks arranged on the floor as addresses with the aid of a magnetic sensor.

The semiconductor device test system of the embodiment comprises, as major components, the first automated warehouse 24, insertion and extraction unit 16, second automated warehouse 18, TBI unit 20, scheduler 21, MC 22, TBI host 23, first AGVs 17, and second AGVs 19.

The operation of the semiconductor device test system thus constructed is now discussed. In the first automated warehouse 24, a plurality of semiconductor devices are placed on each pallet 1 according to the semiconductor device type, and a plurality of such pallets 1 are stored in a magazine 3. When they are stored, product data of the semiconductor devices 2 is transmitted to the scheduler 21. A first operator 5 picks up, from the first automated warehouse 24, a magazine 3 storing the semiconductor devices 2 of the same type, and mounts it on a platform truck 6 to transport it to the insertion and extraction unit 16.

Based on the product data of the semiconductor devices 2 stored in the first automated warehouse 24 and second automated warehouse 18, the scheduler 21 sets an insertion and extraction schedule so that transported from the second automated warehouse 18 to the insertion and extraction unit 16 is either a burn-in carrier 11 storing semiconductor devices 2 that have undergone a test and are of the same type as that of semiconductor devices 2 that are being transported from the first automated warehouse 24 to the insertion and extraction unit 16, or a burn-in carrier 11 that is empty and prepared to be loaded with semiconductor devices 2 of the same type as above. MC 22 instructs the first AGV 17 to transport the burn-in carrier 11 desired in the insertion and extraction schedule from the second automated warehouse 18 to the insertion and extraction unit 16. In this way, the desired burn-in carrier 11 is transported to the insertion and extraction unit 16. The discussion that follows covers the operation subsequent to the arrival of the burn-in carriers 11 loaded with the semiconductor devices 2 at the insertion and extraction unit 16.

The insertion and extraction unit 16 performs the insertion and extraction operations in which the semiconductor devices 2 are extracted from the sockets 8 on the burn-in board 7 and then placed on the empty the pallet 1 while semiconductor devices 2 on the pallet 1 loaded with semiconductor devices 2 are extracted and then placed on the sockets 8 on the burn-in board 7 where the semiconductor devices 2 have just been extracted.

When the insertion and extraction operations are completed, data indicating which sockets of the burn-in board 7 are loaded with semiconductor devices 2 is transmitted to the TBI host 23. The transmitting of the data prevents any empty sockets 8 from being mistaken for the presence of faulty semiconductor devices 2 and giving an erroneous fault rate higher than the actual fault rate level of the semiconductor devices 2, when the semiconductor devices 2 are subjected to the test to be described later.

According to the instruction from MC 22, the first AGV 17 picks up the burn-in carrier 11 loaded with the semiconductor devices 2 of the same type from the insertion and extraction unit 16, and transports it to the second automated warehouse 18 to be stored there. When the semiconductor devices 2 are stored, the product data and storage time of the semiconductor devices 2 are acquired and recorded, for example, by reading bar codes attached to the burn-in carrier 11, and are then transmitted to the scheduler 21. Referring to the product data of the semiconductor devices 2 stored in the second automated warehouse 18, the scheduler 21 sets the test schedule of the semiconductor devices 2 so that the semiconductor devices 2 of two types are tested in parallel concurrently.

MC 22 instructs the second AGV 19 to transport the desired burn-in carrier 11 loaded with the semiconductor devices 2 from the second automated warehouse 18 to the TBI unit 20 according to the test schedule, and thus the desired burn-in carrier 11 is transported to the TBI unit 20.

In the TBI unit 20, the semiconductor devices 2 are tested. The test items carried out here include a burn-in test and read and write tests. To conduct the tests, the test program according to the test schedule is transmitted from the TBI host 23 to the TBI unit 20.

In response to the instruction from MC 22, the burn-in carrier 11 that has undergone the tests is picked up by the second AGV 19 from the TBI unit 20, and is then moved to the second automated warehouse 18 to be stored there. When the burn-in carrier 11 is stored, the product data and storage time of the semiconductor devices 2 are transmitted to the scheduler 21.

According to the insertion and extraction schedule, MC 22 instructs the first AGV 17 to pick up a desired burn-in carrier 11 from the second automated warehouse 18 and transport it on itself to the insertion and extraction unit 16. In the insertion and extraction unit 16, the insertion and extraction operations are performed to extract the semiconductor devices 2 from the burn-in board 7 and place them on the pallet 1.

In the above insertion and extraction operations, the burn-in board 7 loaded with the semiconductor devices 2 is used. When the second automated warehouse 18 stores no burn-in board 7 loaded with semiconductor devices 2 in need of the insertion and extraction operations, a burn-in board 7 that is empty and prepared to be loaded with semiconductor devices 2 in need of the insertion and extraction operations may be transported. In this way, the insertion and extraction operations can be continuously performed without interruptions even if the second automated warehouse 18 has no burn-in boards 7 loaded with the desired semiconductor devices 2.

The test result is transmitted from the TBI host 23 to the insertion and extraction unit 16, which picks up and places any semiconductor devices 2 that are identified as faulty devices by the test result on another pallet 1 rather than on a regular pallet 1. Only the semiconductor devices 2 that have passed the tests are placed on the regular pallet 1. A plurality of such pallets 1 are stored in the magazine 3. The magazine 3 having the semiconductor devices 2 that have undergone the tests is picked up by the first operator 5 from the insertion and extraction unit 16, and is transported on the platform truck 6 to the first automated warehouse 24.

The scheduler 21 sets the test schedule or the insertion and extraction schedule so that the tests or the insertion and extraction operations are forced when the second automated warehouse 18 stores any semiconductor devices 2 which have been waiting for the test longer than a predetermined period of time, for example, one hour or over, or any semiconductor devices 2 which have undergone the tests and are waiting for the insertion and extraction operations. With this arrangement, semiconductor devices 2 to be tested or semiconductor devices 2 that have undergone the tests are prevented from remaining stored and unprocessed in the second automated warehouse 18.

When there are any semiconductor devices 2 that are determined to be in need of retesting in the TBI unit 20, the scheduler 21 gives an instruction to transport the burn-in carrier 11 loaded with such semiconductor devices 2 to the second automated warehouse 18 in the same manner as the other burn-in carriers 11 and then to keep only that burn-in carrier 11 there in the second automated warehouse 18. The product data of the semiconductor devices 2 to be retested is transmitted to the scheduler 21, where a test schedule is newly set. In this case, the tests are conducted without any distinction between the burn-in carrier 11 with semiconductor devices 2 being retested and the burn-in carriers 11 with semiconductor devices 2 being tested for the first time. Once the tests are completed, the burn-in carriers 11 are transported from the TBI unit 20 to the second automated warehouse 18. In this way, the test system is simplified.

In the above discussion, when there are any semiconductor devices 2 that are determined as the ones in need of retesting in the TBI unit 20, the scheduler 21 gives an instruction to transport the burn-in carrier 11 loaded with such semiconductor devices 2 to the second automated warehouse 18 in the same manner as the other burn-in carriers 11 and to keep only that burn-in carrier 11 there in the second automated warehouse 18. The present invention is not limited to the method. Alternatively, the scheduler 21 may give an instruction to continuously keep in the TBI unit 20 any semiconductor devices 2 that are determined as the ones in need of retesting. Since this arrangement allows the unnecessary transportation travel to be skipped, the efficiency of the testing is enhanced.

As described above, since the second automated warehouse 18 is provided in the embodiment of the semiconductor device test system, semiconductor devices 2 of the same type as those transported from the first automated warehouse 24 to the insertion and extraction unit 16 are transported from the second automated warehouse 18. With this arrangement, the insertion and extraction unit 16 is allowed to concurrently perform the insertion and extraction operations, doubling system throughput of the prior art system, and enhancing the testing efficiency.

With the use of the second automated warehouse 18, the TBI unit 20 is capable of concurrently testing four burn-in carriers 11. If the test area of the system is split into two partitions, four burn-in carriers 11 loaded with two types of semiconductor devices 2 can be transported from the second automated warehouse 18 to the TBI unit 20. The throughput of the TBI unit 20 is thus made the most effective use of. Thus, a low-cost TBI unit 20 is employed without reducing the efficiency of testing. The TBI unit 20 with the two-test-area partitioning capability has been described. The present invention is not limited to this arrangement. A TBI unit 20 with no test area partitioning capability is perfectly acceptable.

What is claimed is:

1. A semiconductor device test system comprising:
a plurality of pallets for storing a plurality of semiconductor devices, including a plurality of types of semiconductor devices;
a plurality of burn-in boards for holding the semiconductor devices during testing;
a first warehouse for storing the pallets on which the semiconductor devices are stored;
insertion and extraction means for extracting a semiconductor device from a burn-in board and placing the semiconductor device on a pallet, and for removing a semiconductor device from another pallet and inserting the semiconductor device into the burn-in board;
a second warehouse for storing at least one of a burn-in board including a semiconductor device to be tested, a burn-in board including a semiconductor device that has undergone a test, and a burn-in board without any semiconductor devices;
test means for testing a semiconductor device on a burn-in board;
means for transmitting product data for the semiconductor devices in the first and second warehouses; and
management means coupled to the first and second warehouses, the means for transmitting, and the insertion and extraction means, for establishing an insertion and extraction schedule so that the insertion and extraction means performs insertion and extraction operations according to a type of the semiconductor devices, based on the product data, issuing an instruction to transport a desired burn-in board from the second warehouse to the insertion and extraction means based on the insertion and extraction schedule, and issuing an instruction to transport the desired burn-in board from the insertion and extraction means to the second warehouse responsive to the insertion and extraction schedule.

2. The semiconductor device test system according to claim 1 further comprising:

transport means for transporting the desired burn-in board from the insertion and extraction means to the second warehouse, and for transporting the desired burn-in board from the second warehouse to the insertion and extraction means; and control means coupled to the transport means for informing the transport means which burn-in board to transport, responsive to the insertion and extraction schedule.

3. The semiconductor device test system according to claim 2, wherein the management means establishes the insertion and extraction schedule so that the insertion and extraction operations are forced when the burn-in board loaded with the semiconductor device remains in the second warehouse for at least a predetermined period of time.

4. A semiconductor device test system comprising:

a plurality of pallets for storing a plurality of semiconductor devices, including a plurality of types of semiconductor devices;

a plurality of burn-in boards for holding the semiconductor devices during testing;

a first warehouse for storing the pallets on which the semiconductor devices are stored;

insertion and extraction means for extracting a semiconductor device from a burn-in board and placing the semiconductor device on a pallet, and for removing a semiconductor device from another pallet and inserting the semiconductor device into the burn-in board;

a second warehouse for storing at least one of a burn-in board including a semiconductor device to be tested, a burn-in board including a semiconductor device that has undergone a test, and a burn-in board without any semiconductor devices;

test means for testing a semiconductor device on a burn-in board;

means for transmitting product data for the semiconductor devices in the second warehouse; and management means coupled to the first and second warehouses, the means for transmitting, and the insertion and extraction means, for establishing a test schedule so that the test means tests the semiconductor devices according to a type of the semiconductor devices, based on the product data, issuing an instruction to transmit to the test means a test program that complies with the test schedule, issuing an instruction to transport a desired burn-in board from the second warehouse to the test means based on the test schedule, and issuing an instruction to transport the desired burn-in board from the test means to the second warehouse response to the test schedule.

5. The semiconductor device test system according to claim 4 further comprising:

transport means for transporting the desired burn-in board from the test means to the second warehouse, and for transporting the desired burn-in board from the second warehouse to the test means; and control means coupled to the transport means for informing the transport means which burn-in board to transport, responsive to the test schedule.

6. The semiconductor device test system according to claim 5, wherein the management means establishes the test schedule so that a test is forced when the burn-in board loaded with the semiconductor device remains in the second warehouse for at least a predetermined period of time.

7. The semiconductor device test system according to claim 5, wherein when a semiconductor device needs retesting in the test means, the management means instructs the control means to cause only a burn-in board having a semiconductor device in need of retesting to remain in the second warehouse.

8. The semiconductor device test system according to claim 5, wherein when a semiconductor device needs retesting in the test means, the management means instructs the control means to cause only a burn-in board having a semiconductor device in need of retesting to remain in the test means.

* * * * *